(12) United States Patent
Choi et al.

(10) Patent No.: US 12,507,560 B2
(45) Date of Patent: Dec. 23, 2025

(54) DISPLAY DEVICE

(71) Applicant: LG DISPLAY CO., LTD., Seoul (KR)

(72) Inventors: Suk Choi, Hwaseong-si (KR);
Kyungmin Yeo, Paju-si (KR); Heeyeon Hwang, Hanam-si (KR)

(73) Assignee: LG DISPLAY CO., LTD., Seoul (KR)

( * ) Notice: Subject to any disclaimer, the term of this patent is extended or adjusted under 35 U.S.C. 154(b) by 580 days.

(21) Appl. No.: 17/848,969

(22) Filed: Jun. 24, 2022

(65) Prior Publication Data

US 2022/0415983 A1 Dec. 29, 2022

(30) Foreign Application Priority Data

Jun. 29, 2021 (KR) .................. 10-2021-0084784

(51) Int. Cl.
*H10K 59/35* (2023.01)
*H10K 59/122* (2023.01)

(52) U.S. Cl.
CPC ......... *H10K 59/353* (2023.02); *H10K 59/122* (2023.02)

(58) Field of Classification Search
None
See application file for complete search history.

(56) References Cited

U.S. PATENT DOCUMENTS

| | | | |
|---|---|---|---|
| 8,552,635 B2 | 10/2013 | Kim et al. | |
| 9,853,241 B2 * | 12/2017 | Bi | H10K 59/35 |
| 10,263,054 B2 * | 4/2019 | Kim | H10K 59/121 |
| 10,516,984 B2 * | 12/2019 | Enomoto | H04W 8/005 |
| 11,456,430 B2 * | 9/2022 | Kim | H10K 59/873 |
| 12,374,663 B2 | 7/2025 | Lee et al. | |
| 2010/0207107 A1 * | 8/2010 | Kim | H10K 50/8428 |
| | | | 257/E33.044 |
| 2012/0273804 A1 * | 11/2012 | Hatano | H10K 59/8723 |
| | | | 257/E33.001 |
| 2012/0313123 A1 * | 12/2012 | Kim | H10K 59/8723 |
| | | | 257/89 |

(Continued)

FOREIGN PATENT DOCUMENTS

| | | |
|---|---|---|
| CN | 104051493 A | 9/2014 |
| CN | 110021708 A | 7/2019 |

(Continued)

OTHER PUBLICATIONS

Office Action issued on Jul. 19, 2024 in Korean Patent Application No. 10-2021-0084784.

(Continued)

*Primary Examiner* — Nishath Yasmeen
(74) *Attorney, Agent, or Firm* — Morgan, Lewis & Bockius LLP

(57) ABSTRACT

A display device includes pixels each including a first sub-pixel, a second sub-pixel and a third sub-pixel. Each of the pixels includes a bank disposed on a substrate, wherein the bank includes a first opening defining a light-emitting area of the first sub-pixel, a second opening defining a light-emitting area of the second sub-pixel, and a third opening defining a light-emitting area of the third sub-pixel, and a spacer being disposed on the bank and surrounding the third opening. Spacers in adjacent pixels have different shapes from each other.

14 Claims, 9 Drawing Sheets

(56) References Cited

U.S. PATENT DOCUMENTS

| | | | | |
|---|---|---|---|---|
| 2013/0113363 A1* | 5/2013 | Hong | .................... | H10K 59/353 |
| | | | | 313/498 |
| 2014/0252321 A1* | 9/2014 | Pyon | .................... | H10K 59/122 |
| | | | | 257/89 |
| 2015/0162391 A1* | 6/2015 | Kim | .................... | H10K 59/353 |
| | | | | 257/40 |
| 2016/0254476 A1* | 9/2016 | Park | .................... | H10K 59/352 |
| | | | | 257/40 |
| 2016/0322433 A1* | 11/2016 | Kim | .................... | H10K 59/353 |
| 2017/0194399 A1* | 7/2017 | Cho | .................... | H10K 59/353 |
| 2018/0088736 A1* | 3/2018 | Jeong | .................... | H10K 59/40 |
| 2019/0173042 A1* | 6/2019 | Lim | .................... | H10K 59/131 |
| 2019/0206313 A1* | 7/2019 | Xia | .................... | H10K 59/353 |
| 2020/0144540 A1* | 5/2020 | Lee | .................... | H10K 77/111 |
| 2020/0168823 A1 | 5/2020 | Kim | | |
| 2020/0258959 A1* | 8/2020 | Mao | .................... | H10K 59/8723 |
| 2021/0408163 A1* | 12/2021 | Heo | .................... | H10K 59/353 |
| 2021/0408613 A1* | 12/2021 | Halmo | ................ | H01M 50/491 |
| 2022/0416193 A1* | 12/2022 | Lee | .................... | H10K 59/122 |
| 2023/0309347 A1* | 9/2023 | Huang | ................ | H10K 59/173 |

FOREIGN PATENT DOCUMENTS

| | | |
|---|---|---|
| CN | 111211147 A | 5/2020 |
| CN | 112640114 A | 4/2021 |
| KR | 10-2011-0129531 A | 12/2011 |
| KR | 10-2019-0116962 A | 10/2019 |
| KR | 10-2020-0059814 A | 5/2020 |
| KR | 10-2020-0076278 A | 6/2020 |
| KR | 10-2020-0078091 A | 7/2020 |

OTHER PUBLICATIONS

Office Action issued on Apr. 28, 2025 in Korean Patent Application No. 10-2021-0084784.

Office Action issued on Jul. 12, 2025 in Chinese Patent Application No. 202210736787.2 with English translation.

\* cited by examiner

DISPLAY DEVICE

CROSS-REFERENCE TO RELATED APPLICATION

This application claims priority from Korean Patent Application No. 10-2021-0084784 filed on Jun. 29, 2021 in the Korean Intellectual Property Office, and all the benefits accruing therefrom under 35 U.S.C. 119, the contents of which in its entirety are herein incorporated by reference.

BACKGROUND

Technical Field

The present disclosure relates to a display device. Specifically, the present disclosure relates to a display device that may improve a quality of an image.

Discussion of the Related Art

As society enters a full-fledged information era, various display devices for processing and displaying a large amount of information have been developed. There are various types of display device for displaying an image, such as a liquid crystal display device (LCD), an organic light-emitting display device (OLED), and an electrophoretic display device (EPD).

Users who watch a broadcast or a video or enjoy a video game via the display device tend to prefer a portable display device having a large screen. However, when the screen of the portable display device is enlarged, portability is reduced, so that there is a limit to enlarging the screen. In order to improve the portability, research on a foldable display device capable of folding and unfolding a display panel is being actively conducted.

SUMMARY

Various structures for pixels included in a display area of a display device have been proposed. For example, various shapes and arrangements of sub-pixels constituting the pixel have been proposed. As one of them, a pixel structure in which one pixel includes a red sub-pixel having an inverted trapezoidal red light-emitting area, a green sub-pixel having a trapezoidal green light-emitting area, and a blue sub-pixel having a rhombus-shaped blue light-emitting area has been proposed.

When testing an image quality of the display device, a so-called blue screen test of operating only the blue sub-pixels is performed. In addition to the test, only the blue sub-pixels may be operated in a partial area or the entire area of the display device when actually displaying the image. In this regard, when the blue sub-pixels having the rhombus-shaped blue light-emitting area based on the above-described pixel structure are repeatedly and regularly arranged in a horizontal direction and a vertical direction in a display area, in a process in which blue light having a short-wavelength is emitted from the blue light-emitting areas, diffraction and interference of the blue light occur as a bank surrounding the blue light-emitting areas acts as a slit. Due to the diffraction and the interference of the blue light, an X-shaped or rhombus-shaped mura or moire phenomenon occurs, thereby degrading the image quality. Accordingly, the inventors of the present disclosure have invented a display device in which the mura or the moire can be reduced or the quality of the image can be improved, through several experiments.

Accordingly, embodiments of the present disclosure are directed to a display device that substantially obviates one or more of the problems due to limitations and disadvantages of the related art.

An aspect of the present disclosure is to provide the display device in which the mura or the moire can be reduced or the quality of the image can be improved.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device includes pixels each comprising a first sub-pixel, a second sub-pixel and a third sub-pixel, wherein each of the pixels includes: a bank disposed on a substrate, wherein the bank includes a first opening defining a light-emitting area of the first sub-pixel, a second opening defining a light-emitting area of the second sub-pixel, and a third opening defining a light-emitting area of the third sub-pixel, and a spacer being disposed on the bank and surrounding the third opening. Spacers in adjacent pixels have different shapes from each other.

A display device according to an embodiment of the present disclosure includes a first electrode disposed in a sub-pixel, a bank defining a light-emitting area of the sub-pixel and having an opening for exposing a portion of the first electrode, and a spacer disposed on the bank and surrounding the opening, and the spacer has an opening having a shape different from a shape of the opening of the bank.

A display device according to an embodiment of the present disclosure includes a first pixel and a second pixel disposed adjacent to each other, each comprising at least a blue subpixel, wherein each of the first pixel and the second pixel includes: a bank including an opening for defining a light-emitting area of the blue sub-pixel; and a spacer being disposed on the bank and surrounding the opening, wherein the spacer disposed in the first pixel and the spacer disposed in the second pixel have different shapes from each other.

Specific details of other embodiments are included in the detailed description and the drawings.

According to an embodiment of the present disclosure, it is possible to provide a display device capable of reducing a X-shaped or rhombus-shaped mura or moire that occurs when only blue sub-pixels are operated by disposing a spacer having a shape different from that of a blue light-emitting area of a blue sub-pixel in one of adjacent pixels.

According to an embodiment of the present disclosure, it is possible to provide a display device capable of reducing peeling of a light-emitting part in a foldable area by disposing a spacer having a reverse tapered shape for each pixel.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
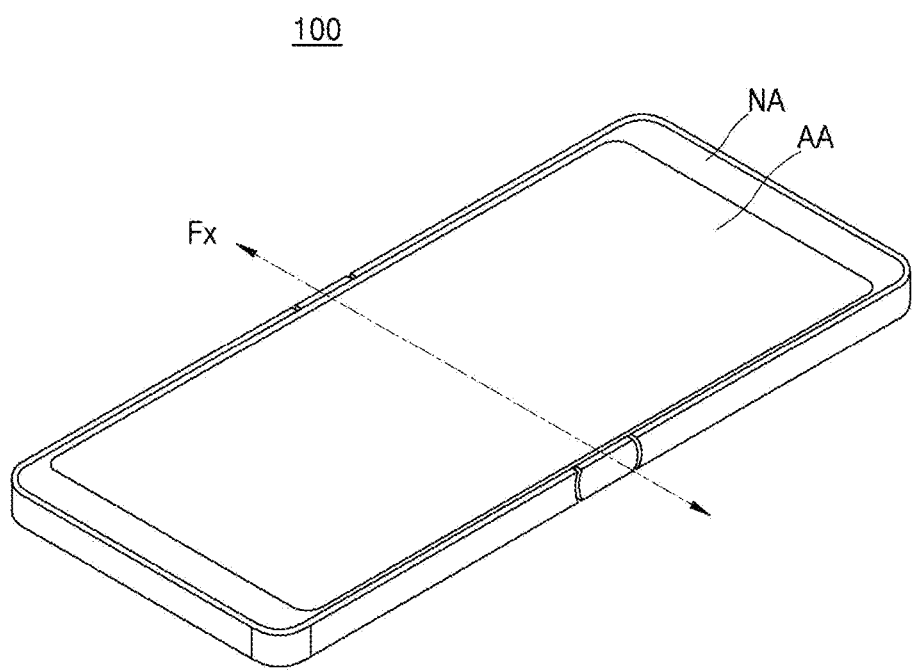
FIG. 1 is a perspective view showing a display device according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element or layer may be disposed directly on the second element or layer or may be disposed indirectly on the second element or layer with a third element or layer being disposed between the first and second elements or layers. It will be understood that when an element or layer is referred to as being "connected to", or "coupled to" another element or layer, it may be directly connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment of the present disclosure will be described in detail with reference to the accompanying drawings.

FIG. 1 is a perspective view showing a display device according to an embodiment of the present disclosure.

Referring to FIG. 1, a display device 100 according to an embodiment of the present disclosure includes a display area AA in which an image is displayed, and a non-display area NA located at an edge of the display area AA and in which the image is not displayed. For example, when the display device 100 is a foldable display device, a foldable area formed around a folding axis Fx and overlapping a portion of the display area AA and a portion of the non-display area NA may be further included. The foldable area may be an area that is folded with a predefined curvature when the foldable display device 100 is folded in at least one scheme among inner folding and outer folding. An area other than the foldable area may be a non-foldable area. Moreover, when the display device 100 is the foldable display device, the display device 100 may further include a hinge structure for folding a display panel or the like, and a casing for supporting and accommodating the display panel or the like.

Figure 2:
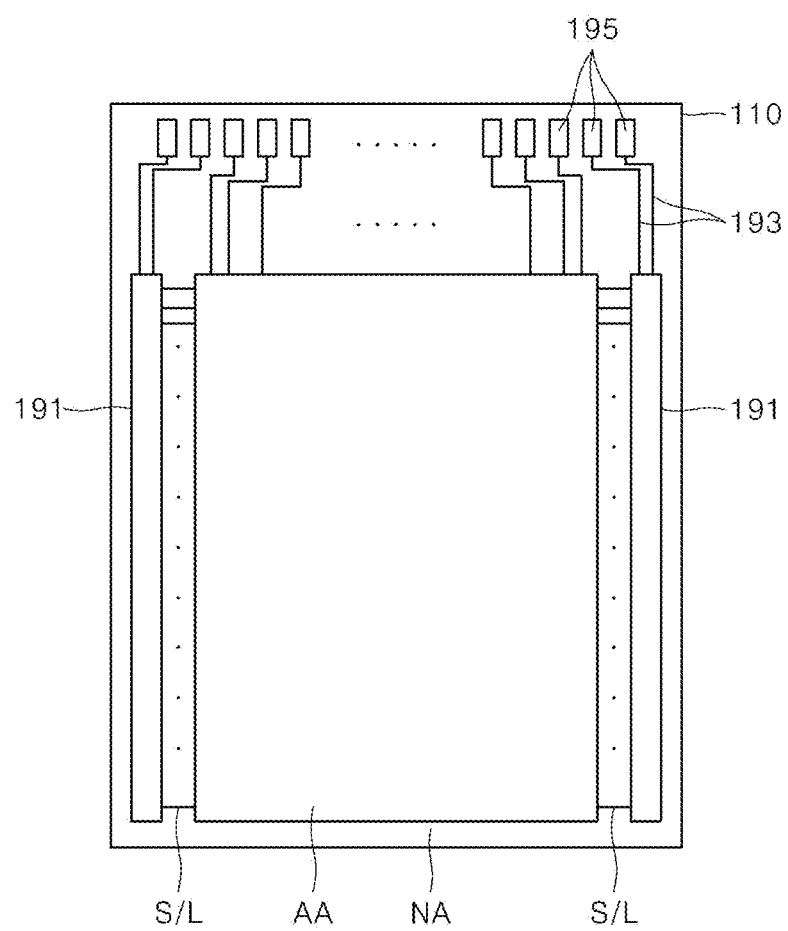
FIG. 2 is a plan view of a display device according to an embodiment of the present disclosure.

FIG. 2 is a plan view of a display device according to an embodiment of the present disclosure.

Referring to FIG. 2, the display device 100 (see FIG. 1) may include, on a substrate 110, the display area AA and the non-display area NA surrounding an outer periphery of the display area AA. In the display area AA, a plurality of pixels that actually emit light by a thin-film transistor and a light-emitting element are disposed. The substrate 110 may be, for example, a flexible substrate. In the non-display area NA of the substrate 110, circuits, such as a gate driver 191 for driving the display device 100, and various signal wirings such as a scan line S/L, a data line, and a wiring 193 may be disposed. Moreover, the gate driver 191 may be disposed as a gate in panel (GIP) on the substrate 110 as shown in FIG. 2. As another example, the gate driver 191 may be connected to the substrate 110 in a tape carrier package (TCP) or chip on film (COF) scheme. Pads 195 are disposed on one side of the non-display area NA of the substrate 110. The scan line S/L, the data line, and the like may also be formed in the display area AA of the substrate 110.

Figure 3:
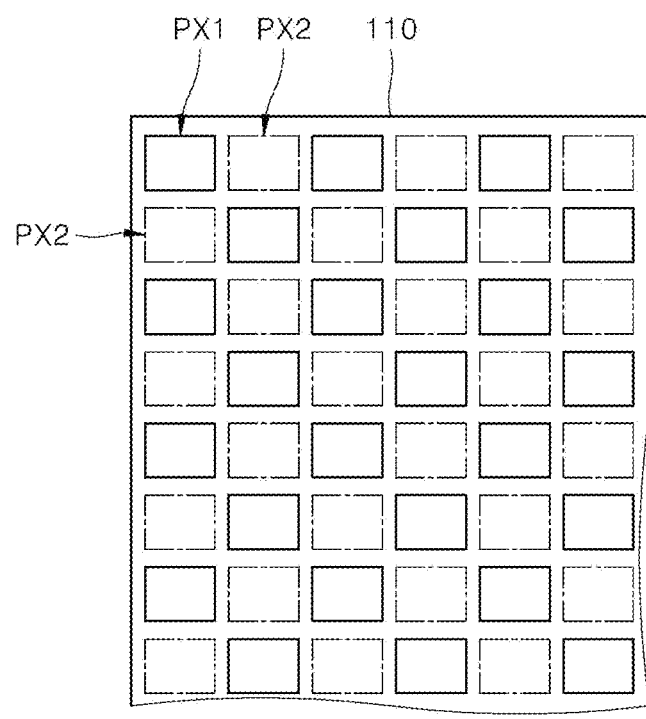
FIG. 3 is a plan view showing an arrangement of pixels of a display device according to an embodiment of the present disclosure.
Figure 4:
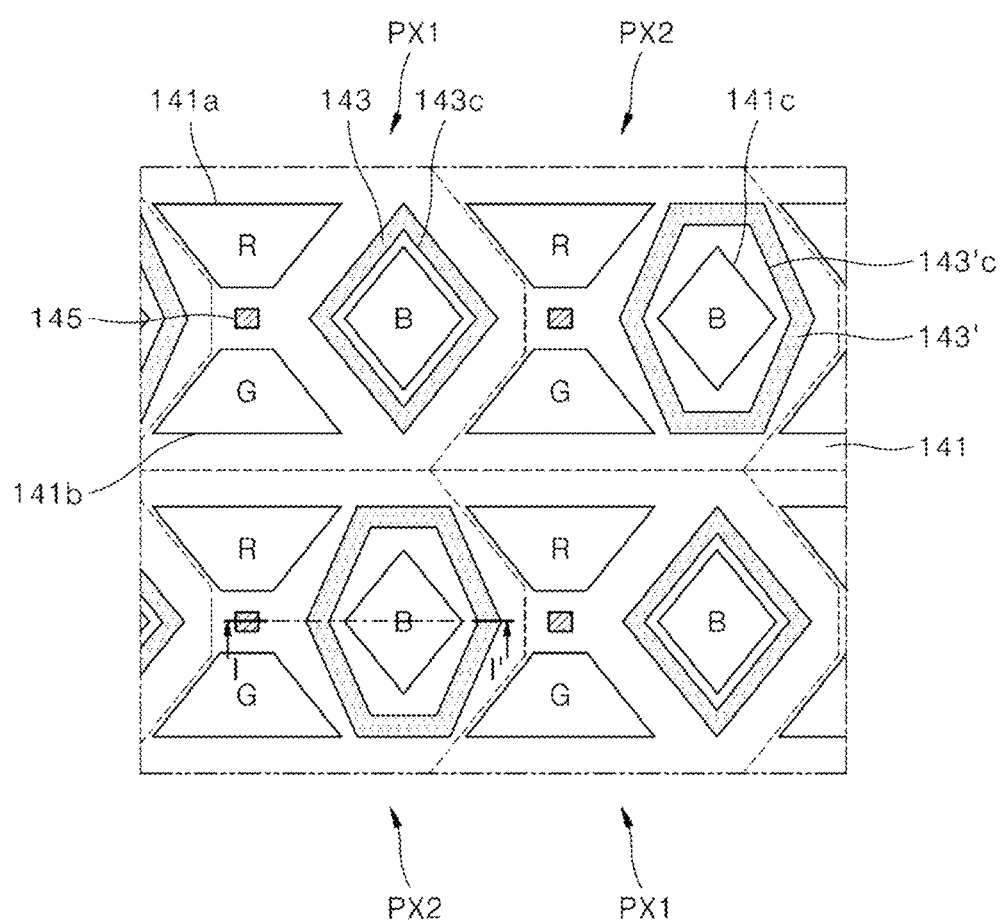
FIG. 4 is a plan view showing some of pixels of a display device according to an embodiment of the present disclosure.

FIG. 3 is a plan view showing an arrangement of pixels of a display device according to an embodiment of the present disclosure. FIG. 4 is a plan view showing some of pixels of a display device according to an embodiment of the present disclosure. For convenience of description, only some components of the display device according to an embodiment of the present disclosure are shown in FIG. 4.

Referring to FIGS. 3 and 4, first pixels PX1 and second pixels PX2 may be disposed on the substrate 110. Each of the first pixels PX1 and the second pixels PX2 may be arranged in a zigzag pattern. As shown in FIG. 3, the first pixels PX1 and the second pixels PX2 may be alternately arranged in a horizontal direction (a row direction) and a vertical direction (a column direction). In an embodiment of the present disclosure, the first pixels PX1 and the second pixels PX2 are distinguished based on a shape of a spacer to be described later, and remaining components thereof are the same.

Each of the first pixel PX1 and the second pixel PX2 may, for example, include a first sub-pixel R emitting red light, a second sub-pixel G emitting green light, and a third sub-pixel B emitting blue light. For example, the first sub-pixel R may be a red sub-pixel, the second sub-pixel G may be a green sub-pixel, and the third sub-pixel B may be a blue sub-pixel.

A bank 141 including first openings 141a defining light-emitting areas of the first sub-pixels R, second openings 141b defining light-emitting areas of the second sub-pixels G, and third openings 141c defining light-emitting areas of the third sub-pixels B may be disposed on the substrate 110. A red light-emitting element emitting the red light may be disposed in the light-emitting area of the first sub-pixel R. A green light-emitting element emitting the green light may be disposed in the light-emitting area of the second sub-pixel G. A blue light-emitting element emitting the blue light may be disposed in the light-emitting area of the third sub-pixel B.

The first opening 141a and the second opening 141b are arranged adjacent to each other in the vertical direction (the column direction) in the first pixel PX1 or in the second pixel PX2. In addition, the third opening 141c may be defined on one side of the first opening 141a and the second opening 141b in the row direction (the horizontal direction). For example, a shape of the first opening 141a and a shape of the second opening 141b may be in mirror-symmetry based on an imaginary line located between the first opening 141a and the second opening 141b and extending in the horizontal direction. The first opening 141a may have, for example, an inverted trapezoidal shape, and the second opening 141b may have, for example, a trapezoidal shape. The third opening 141c may have, for example, a rhombus shape.

For example, the light-emitting area of the first sub-pixel R may have, for example, the inverted trapezoidal shape, and the light-emitting area of the second sub-pixel G may have, for example, the trapezoidal shape. For example, the shape of the light-emitting area of the first sub-pixel R and the shape of the light-emitting area of the second sub-pixel G may be in the mirror symmetry based on an imaginary line located between the first sub-pixel R and the second sub-pixel G and extending in the horizontal direction. The light-emitting area of the third sub-pixel B may have, for example, the rhombus shape.

When the shape of the first opening 141a and the shape of the second opening 141b are vertically symmetrical, an area of the first opening 141a may be the same as an area of the second opening 141b. An area of the third opening 141c may be, for example, larger than the area of the first opening 141a or the area of the second opening 141b.

In the first pixel PX1, a first spacer 143 may be disposed on the bank 141 and surround the third opening 141c. In the second pixel PX2, a second spacer 143' may be disposed on the bank 141 and surround the third opening 141c. For example, in the first pixel PX1, the first spacer 143 may be disposed on the bank 141 and surround the light-emitting area of the third sub-pixel B. In the second pixel PX2, the second spacer 143' may be disposed on the bank 141 and surround the light-emitting area of the third sub-pixel B.

In the first pixel PX1, the first spacer 143 may have an opening 143c having a shape the same as that of the third opening 141c. When the shape of the third opening 141c is the rhombus shape, the opening 143c of the first spacer 143 may have the rhombus shape. In the second pixel PX2, the second spacer 143' may have an opening 143'c having a shape different from that of the third opening 141c. When the shape of the third opening 141c is the rhombus shape, the opening 143'c of the second spacer 143' may have a hexagonal shape. For example, in the first pixel PX1, the first spacer 143 may have the same shape as the shape of the light-emitting area of the third sub-pixel B. In the second pixel PX2, the second spacer 143' may have a shape different from that of the light-emitting area of the third sub-pixel B. When the shape of the light-emitting area of the third sub-pixel B is the rhombus shape, the first spacer 143 disposed in the first pixel PX1 may have the rhombus shape and the second spacer 143' disposed in the second pixel PX2 may have a hexagonal shape. For example, the first spacer 143 may be a first ring spacer. For example, the second spacer 143' may be a second ring spacer.

Figure 9:
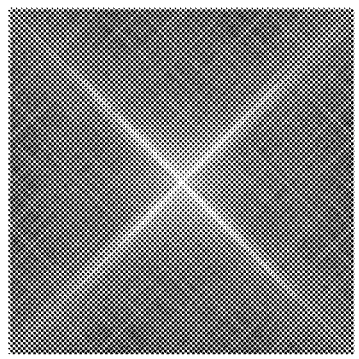
FIG. 9 is a view showing a image quality defect of Comparative Example.

When the blue sub-pixels B having the rhombus-shaped light-emitting areas are repeatedly and regularly arranged in the horizontal direction and the vertical direction in the display area AA, in a process in which the blue light having a short-wavelength is emitted from the blue sub-pixels B, the bank 141 surrounding the light-emitting areas of the blue sub-pixels B acts as a slit, so that the blue light may be diffracted. Due to such diffraction of the blue light, an X-shaped or rhombus-shaped mura or moire phenomenon (see FIG. 9) may occur, thereby reducing the quality of the image. For example, FIG. 9 is a front view of an opening of the blue sub-pixel emitting a blue light. In FIG. 9, a circular diffraction pattern may appear together at a center. For example, a central portion is bright, and a peripheral portion is dark, so that the peripheral portion is not visually recognized. For example, when passing through a cover window on the display device 100, the mura or moire phenomenon may further increase.

According to an embodiment of the present disclosure, the first spacer 143 in the first pixel PX1 has the opening 143c having the same shape as the rhombus shape of the third opening 141c (or the light-emitting area) of the third sub-pixel B, and the second spacer 143' in the second pixel PX2 adjacent to the first pixel PX1 has the opening 143'c having the shape different from the rhombus shape of the third opening 141c (or the light-emitting area) of the third sub-pixel B, so that, in a situation in which only the blue sub-pixels are operated, diffraction characteristics of blue lights emitted from adjacent blue sub-pixels may be different from each other. Therefore, it is possible to reduce or prevent the occurrence of the X-shaped or rhombus-shaped mura or moire phenomenon.

In an embodiment of the present disclosure, the first and the second spacers 143 and 143' may have refractive indices different from that of the bank 141. Accordingly, the different diffraction characteristics of the blue lights emitted from the adjacent blue sub-pixels may be made more effective. Therefore, it is possible to more effectively reduce or prevent the occurrence of the X-shaped or rhombus-shaped mura or moire phenomenon.

Each of the first pixel PX1 and the second pixel PX2 may further include a spacer 145 disposed on the bank 141. The spacer 145 may be disposed between the light-emitting area of the first sub-pixel R and the light-emitting area of the second sub-pixel G, for example. The present disclosure may not be limited thereto, and the spacer 145 may be disposed at various positions.

In order to deposit different light-emitting parts included in the first sub-pixel R, the second sub-pixel G, and the third sub-pixel B, a fine metal mask (FMM), which is a deposition mask, may be used. The spacer 145 may serve to support the fine metal mask and may prevent damage that may be caused by the fine metal mask coming into contact with the bank 141 or the spacers 143 and 143'.

Figure 5:
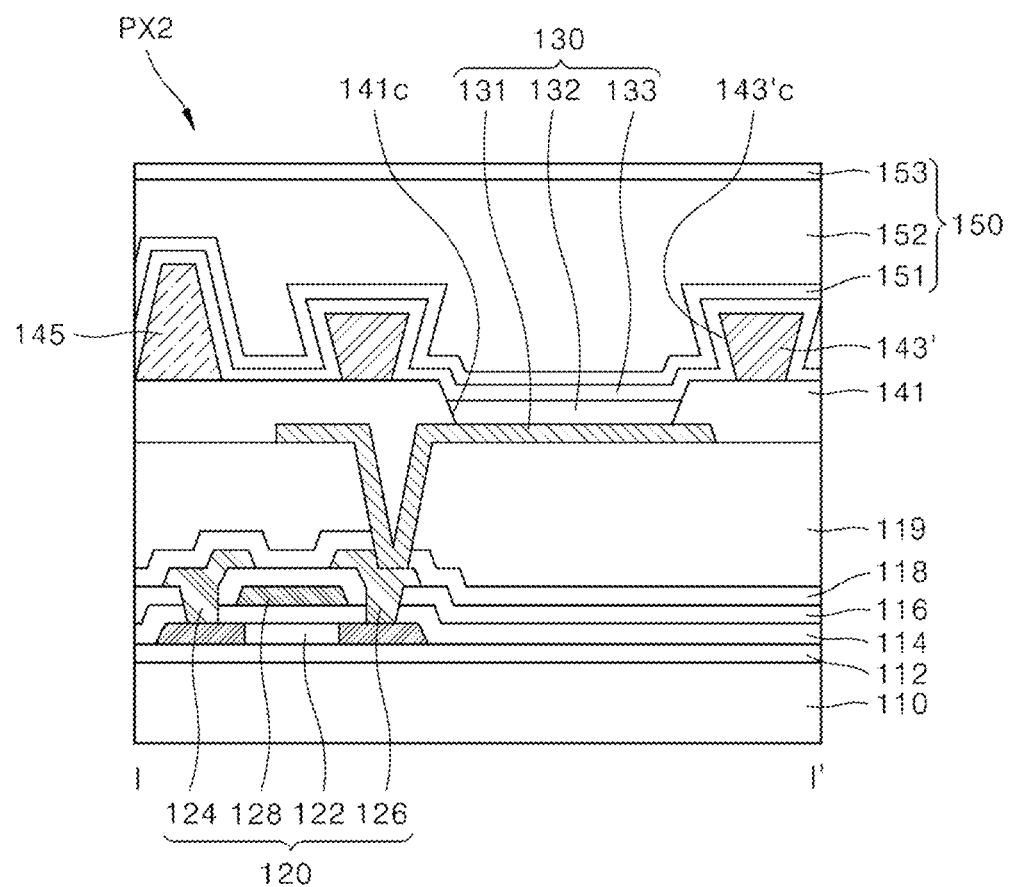
FIG. 5 is a cross-sectional view showing a sub-pixel of a display device according to an embodiment of the present disclosure.

FIG. 5 is a cross-sectional view showing a sub-pixel of a display device according to an embodiment of the present disclosure. FIG. 5 is a cross-sectional view of the third sub-pixel B of the second pixel PX2.

Referring to FIG. 5, the substrate 110 may serve to support and protect components of the display device disposed thereon. The substrate 110 may be a flexible substrate. For example, the substrate 110 may be in a form of a film containing at least one of a polyester-based polymer, a silicone-based polymer, an acrylic polymer, a polyolefin-based polymer, and copolymers thereof. For example, the substrate 110 may be made of at least one of polyethylene terephthalate (PET), polybutylene terephthalate (PBT), polysilane, polysiloxane, polysilazane, polycarbosilane, polyacrylate, polymethacrylate, polymethylacrylate, polymethylmetacrylate, polyethylacrylate, polyethylmetacrylate, a cyclic olefin copolymer (COC), a cyclic olefin polymer (COP), polyethylene (PE), polypropylene (PP), polyimide (PI), polymethylmethacrylate (PMMA), polystyrene (PS), polyacetal (POM), polyetheretherketone (PEEK), polyester sulfone (PES), polytetrafluoroethylene (PTFE), polyvinyl chloride (PVC), polycarbonate (PC), polyvinylidene fluoride (PVDF), a perfluoroalkyl polymer (PFA), a styrene-acrylnitrile copolymer (SAN), and combinations thereof. A buffer layer 112 may be disposed on the substrate 110. The buffer layer 112 composed of a single layer or a plurality of layers of a silicon oxide (SiOx) or a silicon nitride (SiNx) may prevent penetration of moisture or other impurities through the substrate 110 and may flatten a surface of the substrate 110. In another example, the buffer layer 112 may be omitted.

A thin-film transistor 120 disposed on the buffer layer 112 may include a semiconductor layer 122, a source electrode 124, a drain electrode 126, and a gate electrode 128. The thin-film transistor 120 may be a driving thin-film transistor.

The semiconductor layer 122 may be made of amorphous silicon or polycrystalline silicon having better mobility than the amorphous silicon, but may not be limited thereto. As another example, the semiconductor layer 122 may be made of an oxide semiconductor having excellent mobility and uniformity. The oxide semiconductor may contain an indium tin gallium zinc oxide (InSnGaZnO), which is a quaternary metal oxide, an indium gallium zinc oxide (InGaZnO), an indium tin zinc oxide (InSnZnO), an indium aluminum zinc oxide (InAlZnO), a tin gallium zinc oxide (SnGaZnO), an aluminum gallium zinc oxide (AlGaZnO), and a tin aluminum zinc oxide (SnAlZnO), which are ternary metal oxides, an indium zinc oxide (InZnO), a tin zinc oxide (SnZnO), an aluminum zinc oxide (AlZnO), a zinc magnesium oxide (ZnMgO), a tin magnesium oxide (SnMgO), an indium magnesium oxide (InMgO), and an indium gallium oxide (InGaO), which are binary metal oxides, and an indium oxide (InO), a tin oxide (SnO), and a zinc oxide (ZnO), which are unary metal oxides, but may not be limited thereto. The semiconductor layer 122 may include a source region containing p-type or n-type impurities, a drain region, and a channel between the source area and the drain area.

A first insulating layer 114 is an insulating layer composed of a single layer or multiple layers of the silicon oxide (SiOx) or the silicon nitride (SiNx), which may be a gate insulating layer that insulates the semiconductor layer 122 and the gate electrode 128. When the polycrystalline silicon is applied to the semiconductor layer 122, an insulating layer disposed adjacent to the semiconductor layer 122 may be composed of an inorganic insulating layer having a high hydrogen content. For example, when the insulating layer adjacent to the semiconductor layer 122, which is the polycrystalline silicon, is made of the silicon nitride (SiNx) and an insulating layer not adjacent to the semiconductor layer 122 is made of the silicon oxide (SiOx), hydrogen may be diffused into the polycrystalline silicon semiconductor layer 122 and stabilized to prevent deterioration of properties of the thin-film transistor 120. Moreover, when the oxide semiconductor is applied to the semiconductor layer 122, the first insulating layer 114 may be composed of an inorganic insulating layer having a low hydrogen content. For example, the first insulating layer 114 may be made of the silicon oxide (SiOx), and may prevent the hydrogen from diffusing into the oxide semiconductor layer 122, thereby preventing the deterioration of the properties of the thin-film transistor 120.

The gate electrode 128, the source electrode 124, and the drain electrode 126 may be made of copper (Cu), aluminum (Al), molybdenum (Mo), chromium (Cr), gold (Au), titanium (Ti), nickel (Ni), and neodymium (Nd), and may be composed of a single layer or multiple layers of alloys thereof, but the present disclosure may not be limited thereto.

In order to insulate the gate electrode 128, the source electrode 124, and the drain electrode 126 from each other, a second insulating layer 116 made of the silicon oxide (SiOx) or the silicon nitride (SiNx) may be disposed between the gate electrode 128, the source electrode 124, and the drain electrode 126.

A passivation layer 118 composed of the inorganic insulating layer such as the silicon oxide (SiOx) and the silicon nitride (SiNx) may be further disposed on the thin-film transistor 120. The passivation layer 118 may cover the thin-film transistor 120 to prevent contamination from the outside or damage.

Although only the driving thin-film transistor among various active and passive elements that may be included in the sub-pixel of the display device is shown in FIG. 5, a switching thin-film transistor, a capacitor, and the like may be included in the sub-pixel. A structure of the driving thin-film transistor is not limited to that shown in FIG. 5.

A planarization layer 119 may be disposed on the thin-film transistor 120 to protect the thin-film transistor 120, to alleviate a step caused by the thin-film transistor 120, and to reduce a parasitic-capacitance related to the gate line and the data line. The planarization layer 119 may be composed of a single layer or a plurality of layers, and may be made of at least one of an acrylic resin, an epoxy resin, a phenolic resin, a polyamide resin, a polyimide resin, an unsaturated Polyester resin, a polyphenylene resin, a polyphenylenesulfide resin, and a benzocyclobutene, but may not be limited thereto.

A light-emitting element 130 disposed on the planarization layer 119 includes a first electrode 131, a light-emitting part 132, and a second electrode 133. The light-emitting element 130 may be a blue light-emitting element, and the light-emitting part 132 may be a blue light-emitting layer. The first electrode 131 may be an anode and the second electrode 133 may be a cathode.

The first electrode 131 disposed on the planarization layer 119 may contain a transparent conductive material. The transparent conductive material may include an indium tin oxide (ITO), an indium zinc oxide (IZO), and the like, but may not be limited thereto. When the display device is of a top emission type that emits light in an upward direction toward the second electrode 133, a reflective layer may be further included such that the emitted light is reflected from the first electrode 131 and is more smoothly emitted in the upward direction.

For example, the first electrode 131 may have a two-layer structure in which a transparent conductive layer made of a transparent conductive material and the reflective layer are sequentially stacked or may have a three-layer structure in which the transparent conductive layer, the reflective layer, and the transparent conductive layer are sequentially stacked, and the reflective layer may be made of silver (Ag) or an alloy containing the silver.

The light-emitting areas of the sub-pixels that actually emit the light are defined by the bank 141 disposed on the first electrode 131 and the planarization layer 119. The bank 141 may include a third opening 141c defining the light-emitting area of the third sub-pixel B. The bank 141 may cover an edge of the first electrode 131, and a light-emitting part 132 may be disposed on the first electrode 131 exposed by the third opening 141c. As described with reference to FIG. 4, the bank 141 may also include the first opening 141a defining the light-emitting area of the first sub-pixel R and the second opening 141b defining the light-emitting area of the second sub-pixel G. The bank 141 may be made of an organic insulating material having photosensitivity, for example, at least one of polyimide, photoacryl, and benzocyclobutene (BCB). The bank 141 may be formed by applying the organic insulating material and then performing a photolithography process.

The bank 141 may, for example, further include a black pigment. The black pigment may be composed of a carbon-based black pigment, a metal oxide, or the like. Therefore, as the bank 141 is formed as a black bank containing the black pigment, it is possible to remove or prevent interference between pixels.

The second spacer 143' may be disposed on the bank 141 and surround the third opening 141c. FIG. 5 is a cross-sectional view of the second pixel PX2, so that only the second spacer 143' is shown. However, the first spacer 143 may be disposed in the first pixel PX1. As described above, by placing the second spacer 143' having the opening having the shape different from that of the third opening 141c on the bank 141 in the second pixel PX2, it is possible to reduce or prevent the X-shaped or rhombus shaped mura or the moire. The second spacer 143' may be formed to have a reverse tapered shape that increases in width in the upward direction. The second spacer 143' may be made of the organic insulating material having the photosensitivity and may be formed in the reverse tapered structure using a half-tone mask. The second spacer 143' may further contain the black pigment. The black pigment may be composed of the carbon-based black pigment, the metal oxide, or the like. Therefore, as the second spacer 143' contains the black pigment, it is possible to remove the interference between the pixels. The description of the second spacer 143' may be applied to the first spacer 143 in the same manner.

The second electrode 133 and the encapsulation portion 150 may be formed on a top surface and side surfaces of the second spacer 143' of the reverse tapered shape. Similarly, the second electrode 133 and the encapsulation portion 150 may be formed on a top surface and side surfaces of the first spacer 143 (FIG. 4) as well.

When the display device 100 (FIG. 1) is folded, tensile stress and compressive stress may be applied to the foldable area of the display device by the folding. In this regard, peeling of the light-emitting element, for example, the light-emitting part may occur due to continuous application of the tensile stress and the compressive stress resulting from the repeated folding.

As the spacer of the reverse tapered shape is disposed for each pixel, an adhesion area of the second electrode 133 increases, so that adhesion of the second electrode 133 may be improved. Further, because an adhesion area of the encapsulation portion 150 disposed on the second electrode 133 is also increased and the spacer of the reverse tapered shape and the encapsulation portion 150 are engaged with each other, adhesion of the encapsulation portion 150 may be improved. Therefore, the light-emitting part is fixed on the first electrode 131. Accordingly, the peeling of the light-emitting part in the foldable area of the display device 100 (FIG. 1) may be suppressed.

Although the spacer 143' is shown as having the reverse tapered shape of the single layer in FIG. 5, the spacer 143' may have the reverse tapered shape of two or more layers. Therefore, the adhesion of the encapsulation portion 150 may be further improved. Accordingly, the effect of fixing the light-emitting part on the first electrode 131 may be further increased.

The fine metal mask (FMM), which is the deposition mask, may be used to form the light-emitting parts emitting light of different colors of the first to the third sub-pixels. Moreover, the spacer 145 may be disposed on the bank 141. The spacer 145 may support the fine metal mask and may prevent the damage that may be caused by the fine metal mask coming into contact with the bank 141 or the spacers 143 and 143'. To this end, a vertical dimension (or a thickness) of the spacer 145 may be greater than a vertical dimension (or a thickness) of the second spacer 143'.

The spacer 145 may have a shape that decreases in width in the upward direction, for example, a tapered shape, to minimize an area in contact with the fine metal mask. The spacer 145 may be made of the same material as the bank 141, and may be formed simultaneously with the bank 141 through a one mask process using the half-tone mask, but may not be limited thereto. The spacer 145 may contain the black pigment. The black pigment may be composed of the carbon-based black pigment, the metal oxide, or the like. Therefore, as the spacer 145 contains the black pigment, it is possible to remove the interference between the pixels.

The light-emitting part 132 may be disposed between the first electrode 131 and the second electrode 133. The light-emitting part 132 may include at least one layer of a hole injection layer (HIL), a hole transport layer (HTL), a light-emitting layer, an electron transport layer (ETL), and an electron injection layer (EIL). In this regard, the light-emitting layer may be, for example, an organic light-emitting layer.

The hole injection layer may be disposed on the first electrode 131 and may serve to facilitate hole injection. The hole injection layer may be, for example, made of one of HAT-CN(dipyrazino[2,3-f:2',3'-h]quinoxaline-2,3,6,7,10, 11-hexacarbonitrile), CuPc(phthalocyanine), and NPD(N, N'-bis(naphthalene-1-yl)-N,N'-bis(phenyl)-2,2'-dimethylbenzidine).

The hole transport layer may be disposed on the hole injection layer and may serve to smoothly transfer holes to the light-emitting layer. The hole transport layer may be, for example, made of one of NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD(2, 2',7,7'-tetrakis(N,N-dimethylamino)-9,9-spirofluorene), and MTDATA(4,4',4"-Tris(N-3-methylphenyl-N-phenylamino)-triphenylamine).

The light-emitting layer may be disposed on the hole transport layer and may contain a material capable of emitting light of a specific color. Moreover, a light-emitting material may be formed using a phosphorescent material or a fluorescent material.

The light-emitting layer of the light-emitting part 132 may emit the blue light, and a peak wavelength may be in a range from 440 nm to 480 nm. When the light-emitting layer emits the blue light, the light-emitting layer may contain a host material including CBP or mCP, or may be made of the phosphorescent material including a dopant material containing FlrPic(bis(3,5-difluoro-2-(2-pyridyl)phenyl-(2-carboxypyridyl iridium). Further, the light-emitting layer may be made of the fluorescent material containing at least one of spiro-DPVBi(4,4'-Bis(2,2-diphenyl-ethen-1-yl)biphenyl), DSA(1-4-di-[4-(N,N-di-phenyl)amino]styryl-benzene), a polyfluorene (PFO)-based polymer, and a polyphenylenevinylene (PPV)-based polymer.

The light-emitting part including the light-emitting layer emitting the red light may be disposed in the first sub-pixel R. When the light-emitting layer emits the red light, the peak wavelength may be in a range from 600 nm to 650 nm. The light-emitting layer may contain a host material including CBP(4,4'-bis carbazol-9-yl)biphenyl) or mCP(1,3-bis(carbazol-9-yl)benzene), and may be made of the phosphorescent material including a dopant containing at least one of PIQIr(acac)(bis(1-phenylisoquinoline)(acetylacetonate) iridium), PQIr(acac)(bis(1-phenylquinoline)(acetylacetonate)iridium), PQIr(tris(1-phenylquinoline)iridium), and PtOEP(octaethylporphyrin platinum). Further, the light-emitting layer may be made of the fluorescent material including PBD:Eu(DBM)3(Phen) or Perylene.

The light-emitting part including the light-emitting layer emitting the green light may be disposed in the second sub-pixel G. When the light-emitting layer emits the green light, the peak wavelength may be in the range from 510 nm to 590 nm. The light-emitting layer may contain the host material including the CBP or the mCP, and may be made of the phosphorescent material including the dopant material such as an Ir complex containing Ir(ppy)3(tris(2-phenylpyridine)iridium). Further, the light-emitting layer may be made of the fluorescent material including Alq3(tris(8-hydroxyquinolino)aluminum).

It is possible to facilitate a movement of electrons to the light-emitting layer by disposing the electron transport layer on the light-emitting layer. The electron transport layer may be, for example, made of at least one of Liq(8-hydroxyquinolinolato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole, spiro-PBD, BCP(2,9-Dimethyl-4,7-diphenyl-1,10-phenanthroline), and BAlq(bis(2-methyl-8-quinolinolate)-4-(phenylphenolato)aluminum).

The electron injection layer may be further disposed on the electron transport layer. The electron injection layer may facilitate injection of the electrons from the second electrode 133. For example, the electron injection layer may be made of a metal inorganic compound such as $BaF_2$, LiF, NaCl, CsF, $Li_2O$, and BaO, and may be made of an organic compound of at least one of HAT-CN(dipyrazino[2,3-f:2', 3'-h]quinoxaline-2,3,6,7,10,11-hexacarbonitrile), CuPc (phthalocyanine), and NPD(N,N'-bis(naphthalene-1-yl)-N, N'-bis(phenyl)-2,2'-dimethylbenzidine).

The second electrode 133 may be disposed on the light-emitting part 132, and may serve to supply the electrons to the light-emitting part 132. When the display device 100 (FIG. 1) is of the top emission scheme, the second electrode 133 may be made of a transparent conductive oxide such as the indium tin oxide (ITO), the indium zinc oxide (IZO), and an indium tin zinc oxide (ITZO).

The encapsulation portion 150 for preventing the thin-film transistor 120 and the light-emitting element 130 from being oxidized or damaged due to the moisture, the oxygen, or the impurities introduced from the outside may be disposed on the light-emitting element 130. The encapsulation portion 150 may be formed by sequentially stacking a first inorganic film 151, an organic film 152, and a second inorganic film 153, but may not be limited thereto.

The first inorganic film 151 may be disposed on the second electrode 133, and may be made of the silicon oxide (SiOx), the silicon nitride (SiNx), or the aluminum oxide (AlxOy), but the present disclosure may not be limited thereto. The first inorganic film 151 may cover a top surface and side surfaces of each of the spacer 145 and the spacer 143'. The organic film 152 may be disposed on the first inorganic film 151, and silicon oxycarbon (SiOC), acryl or epoxy-based resins may be used as the organic film 152, but the present disclosure may not be limited thereto. The second inorganic film 153 may be disposed on the organic film 152, and may be made of the silicon oxide (SiOx), the silicon nitride (SiNx), or the aluminum oxide (AlxOy), but the present disclosure may not be limited thereto.

Figure 6:
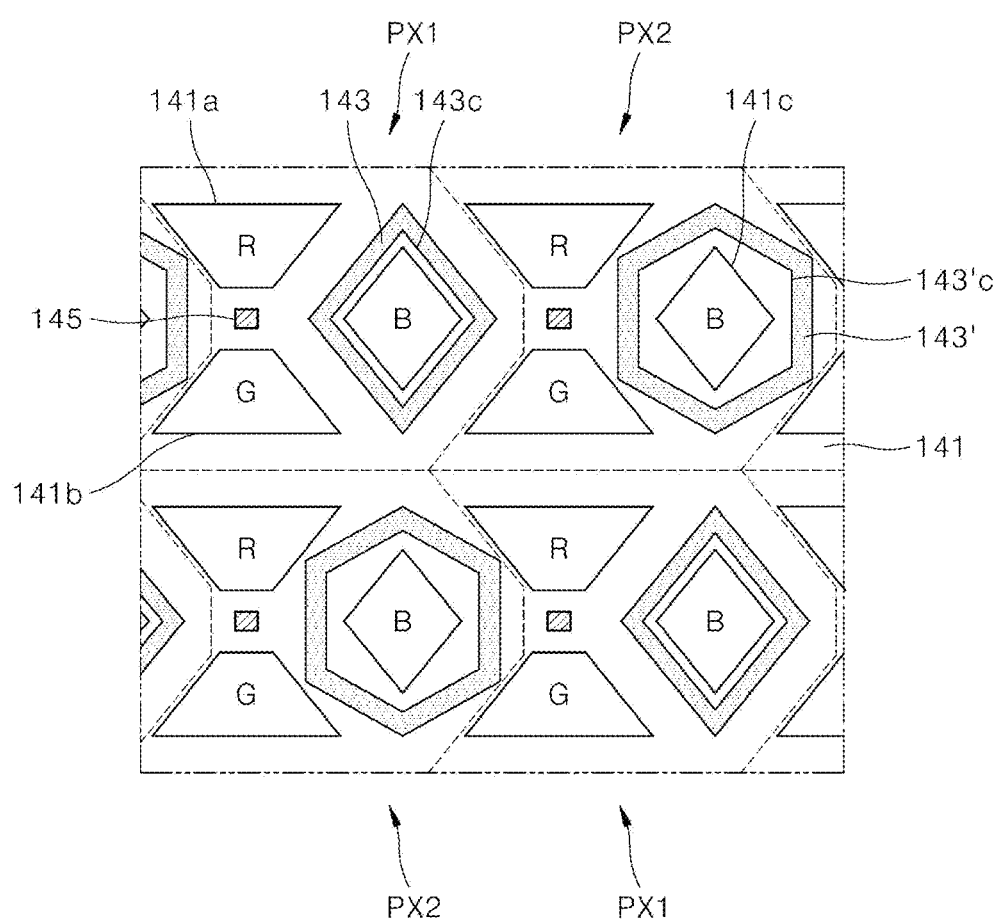
FIGS. 6 to 8 are plan views showing some of pixels of a display device according to an embodiment of the present disclosure.
Figure 7:
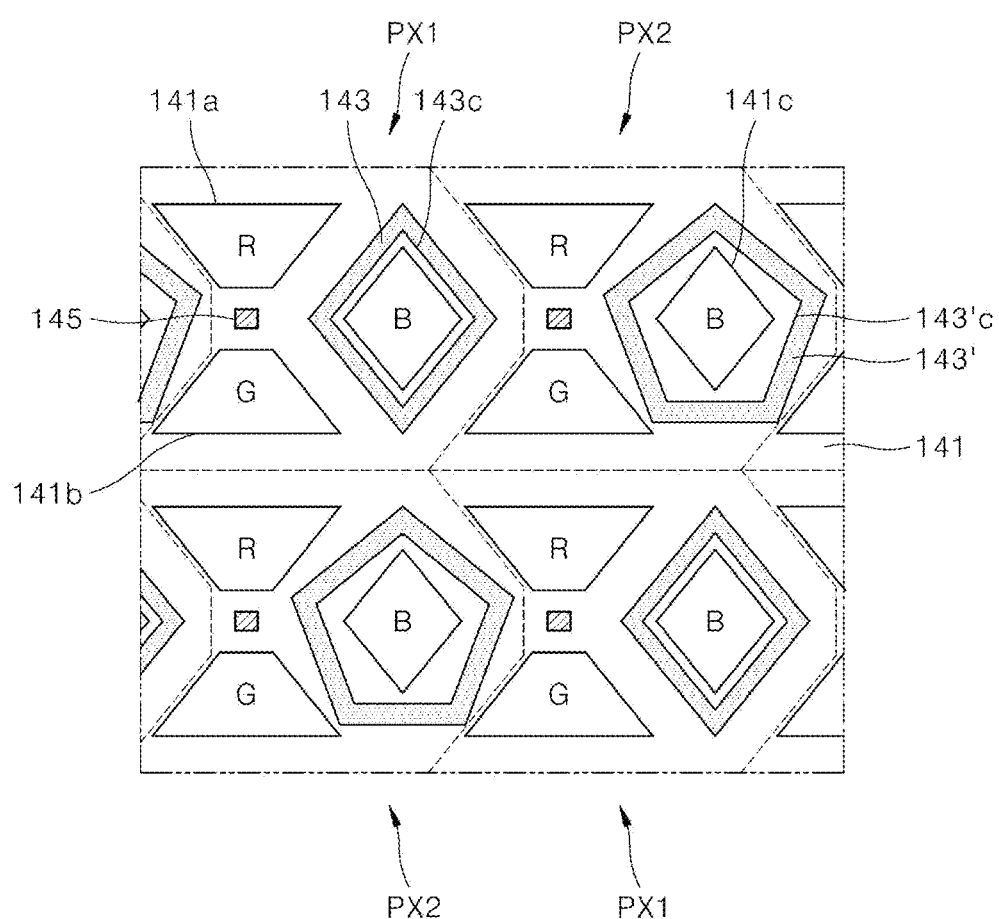
Figure 8:
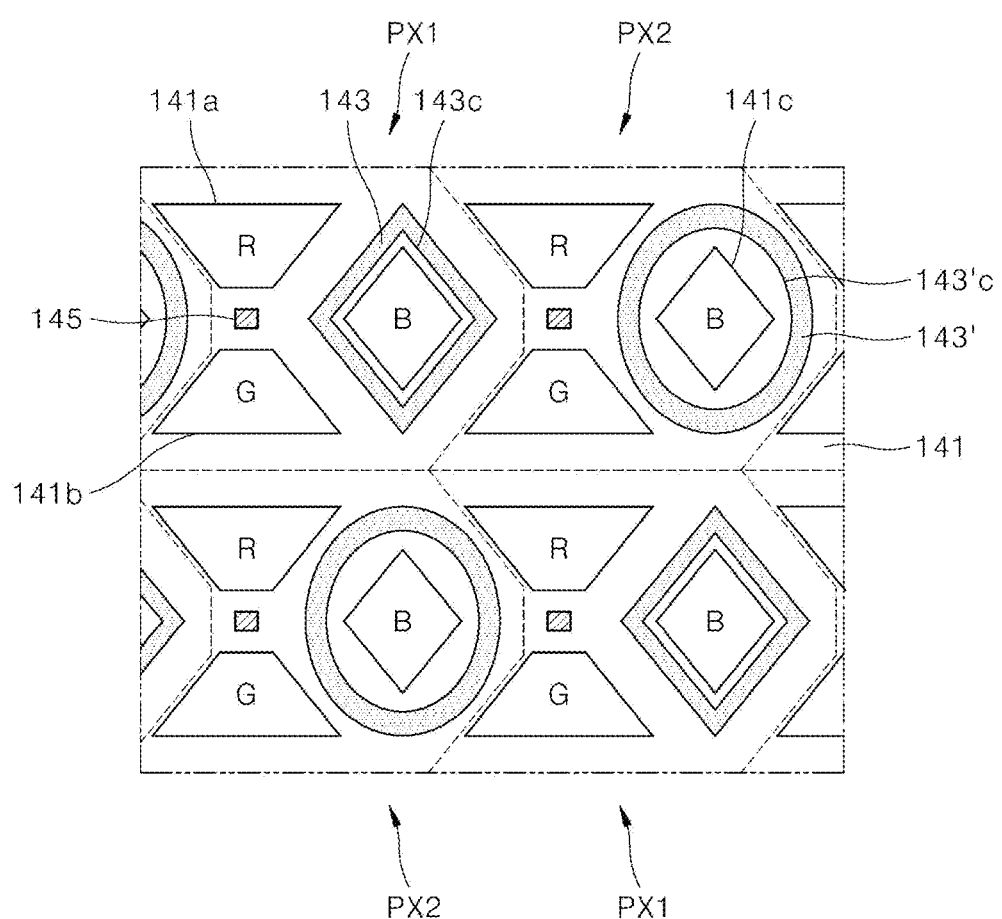

FIGS. 6 to 8 are plan views showing some of pixels of a display device according to an embodiment of the present disclosure.

FIGS. 6 to 8 show embodiments identical to the embodiment of the present disclosure shown in FIG. 4, but the shapes of the second spacer 143' are different.

Referring to FIG. 6, the second spacer 143' has the hexagonal shape. However, an arrangement direction of the hexagonal shape may be different compared to that in FIG. 4.

Referring to FIG. 7, the second spacer 143' may have a pentagonal shape.

Referring to FIG. 8, the second spacer 143' may have an elliptical shape. In another example, the second spacer 143' may have a circular shape.

For example, the embodiments in which the first pixels PX1 and the second pixels PX2 are alternately arranged in the horizontal direction (the row direction) and the vertical direction (the column direction) are described, but the present disclosure is not limited thereto.

According to an embodiment of the present disclosure, the first pixels PX1 may be arranged in the horizontal direction (the row direction) to constitute first rows, the second pixels PX2 may be arranged in the horizontal direction (the row direction) to constitute second rows, and the first rows and the second rows may be alternately arranged in the vertical direction (the column direction).

According to an embodiment of the present disclosure, the first pixels PX1 may be arranged in the vertical direction (the column direction) to constitute first columns, the second pixels PX2 may be arranged in the vertical direction (the column direction) to constitute second columns, and the first columns and the second columns may be alternately arranged in the horizontal direction (the row direction).

According to an embodiment of the present disclosure, each of the first pixels PX1 may not include the first spacer 143, and each of the second pixels PX2 may include the second spacer 143'.

Although the present disclosure has been described above with reference to an example in which each of the first pixel PX1 and the second pixel PX2 includes the red sub-pixel R, the green sub-pixel G, and the blue sub-pixel B, the present disclosure is not limited thereto. For example, each of the first pixel PX1 and the second pixel PX2 may include more or less sub-pixels. In addition, in the case where each of the first pixel PX1 and the second pixel PX2 includes three subpixels, the three subpixels are not limited to the red subpixel R, the green subpixel G, and the blue subpixel B. Accordingly, the description corresponding to the red sub-pixel R, the green sub-pixel G, and the blue sub-pixel B can be similarly applied to other sub-pixels.

For example, the display device according to an embodiment of the present disclosure may be described as follows.

A display device according to an embodiment of the present disclosure, which includes pixels including first to third sub-pixels, further includes a bank disposed on a substrate, wherein the bank includes first openings defining light-emitting areas of the first sub-pixels, second openings defining light-emitting areas of the second sub-pixels, and third openings defining light-emitting areas of the third sub-pixels, and spacers respectively disposed in the pixels, wherein the spacers are disposed on the bank. Each spacer of the spacers surrounds one of the third openings corresponding to the spacer, and the spacers have different shapes in adjacent pixels.

According to some embodiments of the present disclosure, the spacers may include a first spacer disposed in a first pixel of the adjacent pixels and having an opening having the same shape as a shape of the third opening, and a second spacer disposed in a second pixel of the adjacent pixels and having an opening having a shape different from the shape of the third opening.

According to some embodiments of the present disclosure, the third opening may have a rectangular shape, and the second spacer may have a polygonal shape with the number of sides equal to or greater than 5.

According to some embodiments of the present disclosure, the third opening may have a rectangular shape, and the second spacer may have a circular or elliptical shape.

According to some embodiments of the present disclosure, the spacers may have a reverse taper shape having a width increasing in an upward direction.

According to some embodiments of the present disclosure, in each of the pixels, the first opening and the second opening may be defined adjacent to each other in a vertical direction, and the third opening may be defined on one side of the first opening and the second opening in a horizontal direction intersecting the vertical direction.

According to some embodiments of the present disclosure, the first opening may have an inverted trapezoidal shape, the second opening may have a trapezoidal shape, and the third opening may have a rhombus shape.

According to some embodiments of the present disclosure, the first sub-pixel may be a red sub-pixel, the second sub-pixel may be a green sub-pixel, and the third sub-pixel may be a blue sub-pixel.

According to some embodiments of the present disclosure, the first pixel and the second pixel may be alternately arranged in a horizontal direction and a vertical direction.

According to some embodiments of the present disclosure, the display device may further include an additional spacer disposed at a position adjacent to the spacers and having a vertical dimension greater than vertical dimensions of the spacers.

According to an embodiment of the present disclosure, a display device includes a first electrode disposed in a sub-pixel, a bank defining a light-emitting area of the sub-pixel and having an opening for exposing a portion of the first electrode, and a spacer disposed on the bank and surrounding the opening, wherein the spacer has an opening having a shape different from a shape of the opening of the bank.

According to some embodiments of the present disclosure, the opening of the bank may have a rectangular shape, and the opening of the spacer may have one shape of a polygonal shape with the number of sides equal to or greater than 5, a circular shape, and an elliptical shape.

According to some embodiments of the present disclosure, the spacer may have a reverse taper shape having a width increasing in an upward direction.

According to some embodiments of the present disclosure, the display device may further include a light-emitting part disposed on the first electrode and emitting blue light, and a second electrode for covering the light-emitting part and the spacer.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device including pixels each including a first sub-pixel, a second sub-pixel and a third sub-pixel, wherein each of the pixels comprises:
   a bank disposed on a substrate, wherein the bank includes a first opening defining a light-emitting area of the first sub-pixel, a second opening defining a light-emitting area of the second sub-pixel, and a third opening defining a light-emitting area of the third sub-pixel; and
   a spacer being disposed on the bank and having a ring shape surrounding the third opening,
   wherein:
   a first spacer disposed in a first pixel of adjacent pixels has an opening having a same shape as a shape of the third opening; and
   a second spacer disposed in a second pixel of the adjacent pixels has an opening having a shape different from the shape of the third opening.

2. The display device of claim 1, wherein the third opening has a rectangular shape, and the second spacer disposed in the second pixel has a polygonal shape with the number of sides equal to or greater than 5.

3. The display device of claim 1, wherein the third opening has a rectangular shape, and the second spacer disposed in the second pixel has a circular or elliptical shape.

4. The display device of claim 1, wherein each of the first spacer and the second spacer has a reverse taper shape having a width increasing in an upward direction.

5. The display device of claim 1, wherein, in each of the pixels, the first opening and the second opening are defined adjacent to each other in a vertical direction, and the third opening is defined on one side of the first opening and the second opening in a horizontal direction intersecting the vertical direction.

6. The display device of claim 5, wherein the shape of the third opening is different from a shape of at least one of the first opening and the second opening.

7. The display device of claim 5, wherein the first opening has an inverted trapezoidal shape, the second opening has a trapezoidal shape, and the third opening has a rhombus shape.

8. The display device of claim 1, wherein the first sub-pixel is a red sub-pixel, the second sub-pixel is a green sub-pixel, and the third sub-pixel is a blue sub-pixel.

9. The display device of claim 1, wherein the first pixel and the second pixel are alternately arranged in a horizontal direction and a vertical direction.

10. The display device of claim 1, wherein each of the pixels further comprises:
    an additional spacer disposed at a position adjacent to the spacer and having a vertical dimension greater than a vertical dimension of the spacer.

11. A display device comprising:
    a first electrode disposed in a sub-pixel;
    a bank defining a light-emitting area of the sub-pixel and having an opening for exposing a portion of the first electrode; and
    a spacer disposed on the bank and having a ring shape surrounding the opening,
    wherein the spacer has an opening having a shape different from a shape of the opening of the bank.

12. The display device of claim 11, wherein the opening of the bank has a rectangular shape, and
    wherein the opening of the spacer has one shape of a polygonal shape with the number of sides equal to or greater than 5, a circular shape, and an elliptical shape.

13. The display device of claim 11, wherein the spacer has a reverse taper shape having a width increasing in an upward direction.

14. The display device of claim 11, further comprising:
    a light-emitting part disposed on the first electrode and emitting blue light; and
    a second electrode for covering the light-emitting part and the spacer.

* * * * *